United States Patent [19]

Arrathoon

[11] Patent Number: 4,926,367

[45] Date of Patent: *May 15, 1990

[54] METHOD AND APPARATUS FOR PROGRAMMABLE OPTICAL CROSSBAR LOGIC ARRAY WITH DECODERS

[76] Inventor: Raymond Arrathoon, 1409 Chestnut La., Rochester Hills, Mich. 48309

[ * ] Notice: The portion of the term of this patent subsequent to Apr. 11, 2006, has been disclaimed.

[21] Appl. No.: 335,214

[22] Filed: Apr. 7, 1989

Related U.S. Application Data

[63] Continuation of Ser. No. 912,353, Sep. 26, 1986, Pat. No. 4,821,222.

[51] Int. Cl.⁵ .............................................. G06F 7/56
[52] U.S. Cl. .................................................... 364/713
[58] Field of Search ....................... 364/713, 822, 845; 350/96.13, 96.14

[56] References Cited

U.S. PATENT DOCUMENTS

| | | | |
|---|---|---|---|
| 3,680,080 | 7/1972 | Maure | 364/713 X |
| 4,569,033 | 2/1986 | Collins et al. | 364/845 |
| 4,607,344 | 8/1986 | Athale et al. | 364/841 |
| 4,620,293 | 10/1986 | Schlunt et al. | 1/845 |

OTHER PUBLICATIONS

Alexander A. Sawchuk, et al, Digital Optical Computing, Proceedings of the IEEE, 72, pp. 758–779 (Jul., 1984).
T. Sasao, On the Optimal Design of Multiple-Valued PLA's, Proceedings of the Sixteenth International Symposium on Multiple-Valued Logic, pp. 214–223, Library of Congress No. 79–641110 (1986).
A. D. McAulay, Optical Crossbar Interconnected Digital Signal Processor with Basic Algorithms, Optical Engineering, 25, pp. 82–90 (Jan. 1986)
A. Huang, et al., Optical Computation Using Residue Arithmetic, Applied Optics, 18, pp. 149–162 (Jan. 1979).
T. K. Gaylord, et al., Optical Digital Truth Table Look-Up Processing, Optical Engineering, 25, pp. 48–58 (Jan. 1986).
R. Arrathoon, et al., Shadow Casting for Multiple-Valued Associative Logic, Optical Engineering, 25, pp. 29–37 (Jan. 1986).
R. Arrathoon, et al., Integrated Optical Combinatorial Logic Using Electrooptic Bragg Gratings, Proceedings of the Soc. of Photo-Optical Instrumentation Engineers, 578, pp. 207–213 (Sep. 1985).
P. S. Guilfoyle et al., Combinatorial Logic Based Optical Computing, Proceedings of the Society of Photo-Optical Instrumentation Engineers, 639, pp. 102–110 (Apr. 1986).
N. Farhat and D. Psaltis, Optical Implementations of the Hopfield Model, 4–page Article (no date or publication given).
T. Sasao & H. Terada, "Multiple-Valued Logic & The Design of Programmable Logic Arrays With Decoders", Proceedings of the Ninth International Symposium on Multi-Valued Logic, pp. 27–37 (1979).
S. E. Bigbie et al., "Optically Programmed Logic Array", IBM Technical Disclosure Bulletin, vol. 20, No. 8 (Jan. 1978), pp. 2960–2961.
D. Psaltis & N. Farhat, "Optical Information Proceessing Based on an Associative Memory Model of Neural Nets with Thresholding and Feedback", Optics Letters, vol. 10, No. 2, pp. 98–100 (Feb. 1985).

*Primary Examiner*—Gary V. Harkcom
*Assistant Examiner*—Tan V. Mai
*Attorney, Agent, or Firm*—Harness, Dickey & Pierce

[57] ABSTRACT

Arrangements and methods for the design of a hybrid optical/electronic system that implements logic or computing functions. The system consists of a programmable hybrid optical/electronic INVERT-OR-INVERT-OR logic array that is functionally equivalent to a conventional AND-OR electronic programmable logic array (PLA) device with decoders. In the hybrid system, electronic decoders send spatially coded binary input information to a row of optical emitters. A programmable optical crossbar is then employed to perform a row by row INVERT-OR operation. Light emerging from the crossbar impinges on a column of optical detectors, and the individual detector outputs are subsequently INVERTED electronically. One or more of the resulting signals are then electronically or optically OR'd together.

13 Claims, 12 Drawing Sheets

ED&OC - electrical decoder & optical emitter block
POIA - programmable optical INVERT array
OD&EI - optical detector & electrical INVERT block

DI - detector/INVERT block

Fig. 4

|   | 18 | 19 | 20 | 21 | 9c |
|---|---|---|---|---|---|
| w | x | y | z | | f |
| 0 | 0 | 0 | 0 | | 1 |
| 0 | 0 | 0 | 1 | | 1 |
| 0 | 0 | 1 | 0 | | 1 |
| 0 | 0 | 1 | 1 | | 0 |
| 0 | 1 | 0 | 0 | | 1 |
| 0 | 1 | 0 | 1 | | 1 |
| 0 | 1 | 1 | 0 | | 0 |
| 0 | 1 | 1 | 1 | | 1 |
| 1 | 0 | 0 | 0 | | 1 |
| 1 | 0 | 0 | 1 | | 0 |
| 1 | 0 | 1 | 0 | | 0 |
| 1 | 0 | 1 | 1 | | 1 |
| 1 | 1 | 0 | 0 | | 0 |
| 1 | 1 | 0 | 1 | | 1 |
| 1 | 1 | 1 | 0 | | 1 |
| 1 | 1 | 1 | 1 | | 0 |

Fig. 6

|   | 18 | 19 | 20 | 21 | 9c |
|---|---|---|---|---|---|
| w | x | y | z | | f |
| 0 | X | 0 | X | | 1 |
| 0 | 0 | 1 | 0 | | 1 |
| 0 | 1 | 1 | 1 | | 1 |
| 1 | 0 | 0 | 0 | | 1 |
| 1 | 0 | 1 | 1 | | 1 |
| 1 | 1 | 0 | 1 | | 1 |
| 1 | 1 | 1 | 0 | | 1 |

METHOD AND APPARATUS FOR PROGRAMMABLE OPTICAL CROSSBAR LOGIC ARRAY WITH DECODERS

This is a continuation of patent application Ser. No. 06/912,353 filed September 26, 1986, now U.S. Pat. No. 4,821,222.

BACKGROUND--FIELD OF INVENTION

This invention relates generally to an optical logic based computing method or process and to devices and systems for practicing such methods. More particularly this invention relates to optical crossbar based hybrid optical/electronic methods and arrangements for implementing a programmable INVERT-OR-INVERT-OR logic array with decoders that is functionally equivalent to an electronic AND-OR programmable logic array (PLA) device with decoders.

BACKGROUND--DESCRIPTION OF PRIOR ART

Reference may be had to "Digital Optical Computing," Proceedings of the IEEE, 72, pp. 758-779 (July, 1984) for general background information pertaining to digital optical logic and digital optical computing. General background information with respect to the state of the art in electronic PLA's with decoders is provided in a paper by T. Sasao and H. Terada entitled "Multiple-Valued Logic and the Design of Programmable Logic Arrays with Decoders," Proceedings of the Ninth International Symposium on Multiple-Valued Logic, pp. 27-37, Library of Congress No. 79CH1408-4C (1979) and in another paper by T. Sasao entitled "On The Optimal Design of Multiple-Valued PLA's," Proceedings of the Sixteenth International Symposium on Multiple-Valued Logic, pp. 214-223, Library of Congress No. 79-641110 (1986).

Optical crossbar structures for interconnecting a number of electronic processors are described by A. D. McAulay in a paper entitled "Optical Crossbar Interconnected Digital Signal Processor with Basic Algorithms," Optical Engineering, 25, pp. 82-90 (January 1986). This paper describes the use of a globally connected crossbar structure for optical interconnect applications. It does not suggest that such a structure may be used as an integral portion of a hybrid optical/electronic INVERT-OR-INVERT-OR logic array as described in this invention.

The use of an optical crossbar geometry to realize an outer product is described by Psaltis and Farhat in a paper entitled "Optical Information Processing Based on an Associative-Memory Model of Neural Nets with Thresholding and Feedback," Optics Letters, 10, pp. 98-101 (February 1985). Unlike the device described in this invention, no spatial decoder is used to distinguish between one's and zero's or between general combinational functions; moreover, the simple outer product device is not equivalent to an INVERT-OR-INVERT-OR logic array and is incapable of realizing a general logic function as described in this invention.

The use of an optical crossbar geometry with spatial decoder to implement residue arithmetic is developed in a classic paper by A. Huang, Y. Tsuoda, J. W. Goodman, and S. Ishihara entitled "Optical Computation Using Residue Arithmetic," Applied Optics, 18, pp. 149-162 (January 1979). This device is not equivalent to an INVERT-OR-INVERT-OR logic array as described in this invention.

A holographic implementation of optical logic from the point of veiw of a content-addressable memory is discussed by T. K. Gaylord, M. M. Mirsalehi, and C. C. Guest in a paper entitled "Optical Digital Truth Table Look-up Processing," Optical Engineering, 25, 48-58 (January 1986). The paper discusses the realization of large truth tables by matching inputs to stored reference patterns. Although this approach is capable of implementing general logic, the physical mechanism for doing so does not rely on the crossbar architecture.

A shadow-casting implementation of optical logic, also from the perspective of a content-addressable memory, is discussed by R. Arrathoon and S. Kozaitis in a paper entitled "Shadow Casting for Multiple-Valued Associative Logic," Optical Engineering, 25, pp. 29-37 (January 1986). The technique does use spatial decoders, but the physical approach for realizing optical logic again does not rely on a optical crossbar INVERT-OR-INVERT-OR logic array.

A proposal for an optical PLA utilizing an integrated optical structure is presented by R. Arrathoon, E. R. Schroeder, and F. Westervelt in a paper entitled "Integrated Optical Combinatorial Logic Using Electro-optic Bragg Gratings," Proceedings of the Society of Photo-Optical Instrumentation Engineers, 578, pp. 207-213 (September 1985). In this approach electro-optic Bragg gratings are employed in a planar structure. The integrated optical approach described is quite different from the three dimensional crossbar arrangement presented in this invention.

A proposal for an optical programmable array logic (PLA) device is discussed by P. S. Guilfoyle and W. J. Wiley in a paper entitled "Combinatorial Logic Based Optical Computing," Proceedings of the Society of Photo-Optical Instrumentation Engineers, 639, pp. 102-110 (April 1986). Both two and three dimensional structures are presented in this article; however, the proposal does not specifically describe a crossbar architecture, as discussed in the present invention. The paper by P. S. Guilfoyle and W. J. Wiley describes a serial two-input optical AND gate structure obtained by cascading two spatial light modulators. An allusion is made to handling multiple-input AND gates either by cascading more spatial light modulators or by attempting to use each pixel in a given spatial light modulator more than once. The proposal does not take advantage of one of the principal advantages of optical technology; specifically, the ability to form optical gates that accept a very large number of parallel inputs. The present invention emphasizes a fully parallel optical gate structure that does accept a large number of inputs. The architecture is such that each pixel is used only once. The PLA presented in the paper by P. S. Guilfoyle and W. J. Wiley operates on the sequence AND-OR-INVERT, while that of the present invention operates on the sequence INVERT-OR-INVERT-OR.

All of the previous systems suffer from one or more important deficiencies. Either they do not utilize spatial decoders or they do not utilize a globally connected crossbar architecture or they are incapable of acting as a general INVERT-OR-INVERT-OR logic array or they do not utilize fully parallel multiple-input optical gates in either the AND array segment of a PLA device or in the INVERT-OR-INVERT array segment of an equivalent device.

In accordance with the presently preferred embodiments of this invention a globally connected optical crossbar structure with a series of multiple-input optical OR gates forms an integral part of a programmable hybrid optical/electronic INVERT-OR-INVERT-OR logic array with decoders.

SUMMARY OF THE INVENTION

This invention provides a method and apparatus for optical computing having provisions for a programmable hybrid optical/electronic INVERT-OR-INVERT-OR logic array that is functionally equivalent to a conventional electronic programmable AND-OR logic array.

In one of its aspects, this invention uses a series of electronic decoders to supply electronic inputs to a series of semiconductor lasers or light emitting diodes that are spatially positioned along a row array. The optical signal from each element of the row is fanned-out in a free-space globally connected crossbar arrangement to each column of a spatial light modulator. Individual elements or pixels of the spatial light modulator are selected to be either transmitting or non-transmitting according to the complement or INVERT of each decoder output function described by the standard AND array representation of PLA AND-OR logic. A crossbar geometry is used to fan in the light emerging from the spatial light modulator and multiple OR each row onto a column array of optical detectors. The electronic output from each detector is INVERTED, and one or more of these signals is electronically OR'd to provide the desired output. The system follows the sequence INVERT-OR-INVERT-OR.

In another aspect of this invention, the input fan-out is increased and more detectors are employed so that a number of different logic functions corresponding to a number of independent INVERT-OR-INVERT-OR operations are performed in parallel on the same set of inputs.

In another aspect of this invention the free-space implementation of the optical crossbar arrangement is replaced by a fiber optic implementation that connects one fiber to each active element of the spatial light modulator. The fibers may be used on one or both sides of the spatial light modulator.

In another aspect of this invention, the spatial light modulator is periodically reconfigured so that the overall system may now be regarded as the equivalent of a dynamically reprogrammable PLA with decoders.

In another aspect of this invention, the spatial light modulator is replaced by a fixed mask with a fixed pattern of transmitting or nontransmitting pixels. In this implementation, the overall system may now be regarded as the equivalent of a standard PLA with decoders.

In another aspect of this invention the final OR in the sequence INVERT-OR-INVERT-OR is undertaken optically. Here the inverted output from each detector is used to drive a separate semiconductor laser or light emitting diode. The output light is collected optically onto a single optical detector to provide the final electrical output.

An object of this invention is to provide a hybrid optical/electronic INVERT-OR-INVERT-OR logic array with decoders that is equivalent to a standard electronic PLA with decoders.

An object of this invention is to provide a programmable hybrid optical/electronic INVERT-OR-INVERT-OR logic array with decoders that is equivalent to a dynamically reprogrammable PLA with decoders.

In another of its aspects, it is an object of this invention to provide a hybrid optical/electronic INVERT-OR-INVERT-OR logic array or a programmable hybrid optical/electronic INVERT-OR-INVERT-OR logic array that overcomes many of the restrictions of existing PLA's in terms of reconfiguration speed, number of inputs, and number of product terms that can be handled simultaneously.

BRIEF DESCRIPTION OF THE DRAWINGS

These and other objects and advantages will become clear when the following specifications are considered together with the accompanying drawings in which.

DETAILED DESCRIPTION OF THE PREFERRED EMBODIMENTS

Figure 1:
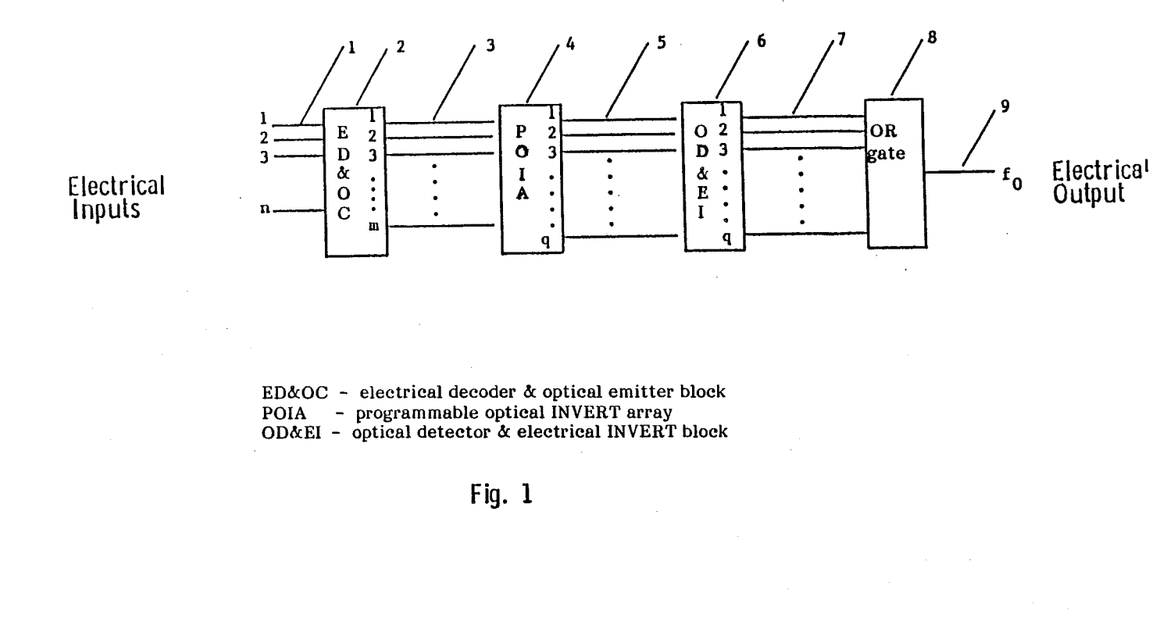
FIG. 1 depicts in block form the various hybrid optical/electronic INVERT-OR-INVERT-OR logic array segments that generally may be employed in practicing this invention.

A general block diagram depicting the basic segments of a single-output hybrid optical/electronic programmable INVERT-OR-INVERT-OR logic array equivalent to a single-output conventional AND-OR programmable logic array (PLA) device is depicted in FIG. 1. The binary input bits are shown as n individual electrical input lines generally indicated by the numeral 1 that are connected to a combined electrical decoder and optical emitter block 2. Decoder/emitter block 2 has m individual optical output lines generally indicated by the numeral 3. Each of m optical lines 3 has a fan-out of q. The optical signals are passed through a programmable optical INVERT array 4 and ultimately exit as q individual optical output lines generally indicated by the numeral 5. Each of q optical lines 5 has a fan-in of m and constitutes an m input optical-in/optical-out PSEUDO OR gate, hereafter referred to as an OR gate. The q optical output lines 5 are passed through a combined optical detector and electrical INVERT block 6. The combination INVERT-OR-INVERT is logically equivalent to the AND operation in a conventional electronic PLA device. The signals from block 6 emerge as q electrical lines 7 entering an electrical OR gate 8 with a single electrical output line 9 that provides the desired output function.

Figure 2:
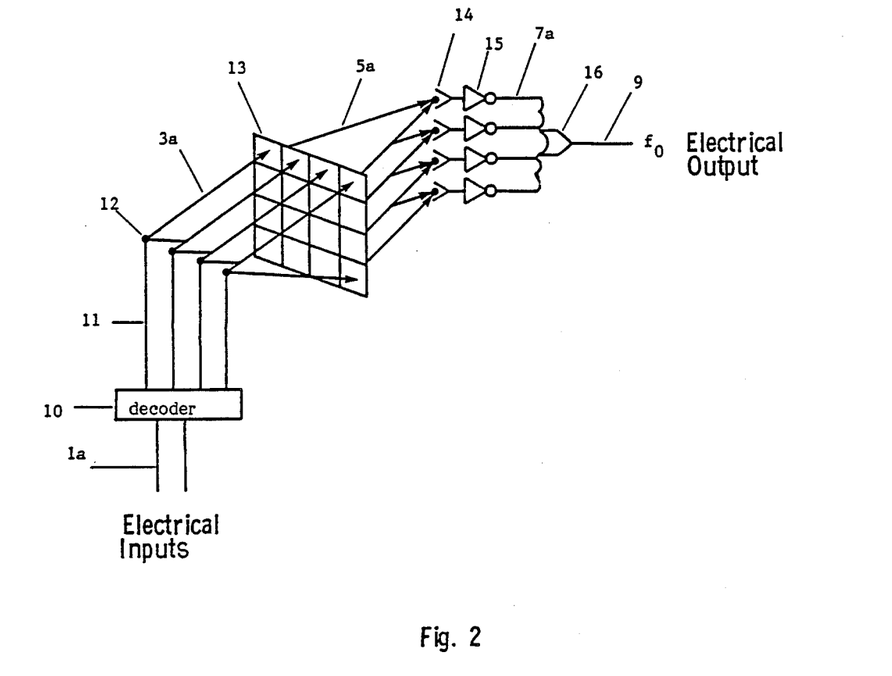
FIG. 2 depicts a free-space optical crossbar and a specific input-output architecture that may be employed in practicing this invention.

A combined block diagram and three-dimensional view of one specific implementation of FIG. 1 is depicted in FIG. 2. The two electrical inputs generally indicated by the alphanumeric symbol 1a enter a 2:4 electrical decoder 10 that has m=4 electrical output lines generally indicated by the numeral 11. Each electrical output line 11 is connected to an optical emitter that may be either a semiconductor laser or a light emitting diode (LED) that is generally indicated by the numeral 12. The free-space optical outputs from these emitters are generally indicated by the alphanumeric symbol 3a and are fanned-out by a factor of q=4 to one of m=4 columns of a spatial light modulator 13 that performs an optical INVERT operation. This operation is effected by setting individual pixels of the spatial light modulator 13 as either transmitting or opaque according to the complement or INVERT of each output function described by the standard AND array representation of PLA AND-OR logic. Specific examples of the optical INVERT process are provided later in this section. Free-space optical signals generally indicated by the alphanumeric symbol 5a from each of q=4 rows are fanned-in by a factor of m=4 to form q=4 multiple-input optical OR gates, and each optical signal 5a is detected by one of q=4 detectors generally indicated by the numeral 14. Each detector output is INVERTED electrically. The electrical INVERT operation is generally indicated by the numeral 15. The resulting q=4 electrical outputs are generally indicated by the alphanumeric symbol 7a, and these outputs are electrically OR'd 16 to obtain the desired output function at the electrical output line 9.

Figure 3:
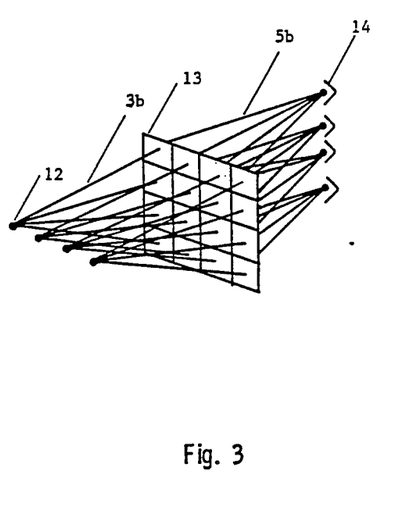
FIG. 3 depicts a fiber-optic implementation of an optical crossbar.

The free space optical fan-out connections 3a and the free-space optical fan-in connections 5b of FIG. 2 are generally effected through the use of anamorphic optical imaging systems in accordance with well-known state of the art practices and principles. Representative examples of this technology are presented in a review paper by A. D. McAulay entitled "Optical Crossbar Interconnected Digital Signal Processor with Basic Algorithms," Optical Engineering, 25, pp. 82–90 (January 1986). FIG. 3 depicts an alternate fiber optic approach to effect the necessary optical fan-out and fan-in connections. Fiber optic links from the optical emitters 12 are fanned-out to m=4 bundles of q=4 optical fibers, where each bundle is generally indicated by the alphanumeric symbol 3b. The optical output from each fan-out bundle 3b is optically imaged onto one of m=4 columns of the spatial light modulator 13. Light emerging from each of q=4 rows of the spatial light modulator is optically imaged onto a fan-in bundle of m=4 optical fibers generally indicated by the alphanumeric symbol 5b, and each bundle is connected by fiber optic link to q=4 detectors 14. Depending on economic considerations, the fiber optic connections need not be used on both sides of the spatial light modulator, but may be used on one side only. In this way, some optimum economic mix of anamorphic free space connections with fiber optic connections may be effected.

One important aspect of the architecture just described with respect to existing electronic PLA devices should now be emphasized. The hybrid optical/electronic system is actually a dynamically reprogrammable PLA device in which the INVERT-OR-INVERT sequence that is equivalent to the AND array representation of a typical electronic PLA device can be altered periodically. This is accomplished by varying the transmission characteristics of the spatial light modulator. In a typical electronic PLA device as described in *PAL Databook* issued by National Semiconductor Corporation, Santa Clara, CA (1982), the AND array is set with fusible links that can only be programmed once. Although, more expensive PLA's are capable of dynamically altering their programming, the reconfiguration speed of the hybrid optical/electronic system described in this invention is potentially superior to that of electronic PLA's.

Another important aspect of the hybrid optical/electronic system described in this invention is that the fan-out and fan-in is potentially superior to that of electronic PLA's. In electronic technology, the fan-in and fan-out limitations restrict the capablilities of the PLA devices. Typical electronic PLA devices as described in *PAL Databook* issued by National Semiconductor Corporation, Santa Clara, CA (1982) can handle a maximum of sixteen input variables. The hybrid optical/electronic system set forth in this invention is potentially capable of handling hundreds of input variables simultaneously.

The fan-out and fan-in advantages of the hybrid optical/electronic system set forth in this invention are so substantial that another mode of operation may be envisioned in which it is possible to replace the spatial light modulator 13 described in this invention and specifically depicted in FIGS. 2 and 3 by a fixed mask with pixels that are either transmitting or opaque. In this mode of operation the hybrid optical/electronic device is essentially equivalent to a simple PLA device in which the fuses are blown and the device is programmed only once.

Figure 4:
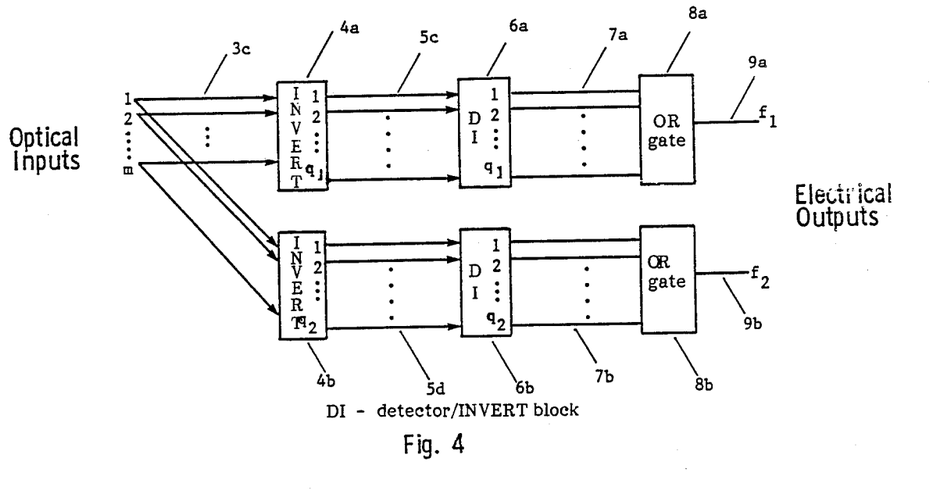
FIG. 4 depicts in block form the input fan-out that generally may be employed in practicing a multiple-function implementation of this invention.

The general block diagram of FIG. 1 depicts a hybrid optical/electronic PLA system that is capable of implementing only one logic function at a time. FIG. 4 depicts an extension of the principles set forth in this invention and generally depicted in FIG. 1 to permit the parallel realization of more than one logic function simultaneously. In FIG. 4 the optical inputs from m optical emitters are fanned out by a factor equal to $q_1+q_2$. The corresponding optical lines are generally indicated by the alphanumeric symbol 3c. Optical lines 3c are connected to two independent optical INVERT blocks 4a and 4b. Optical INVERT blocks 4a and 4b have $q_1$ and $q_2$ individual optical output lines respectively indicated by the numerals 5c and 5d. These signals are applied respectively to detector/INVERT blocks 6a and 6b and ultimately exit as individual electrical output lines respectively indicated by the numerals 7a and 7b. OR gates 8a and 8b then connect respectively to lines 9a and 9b to provide the desired parallel outputs.

Figure 5:
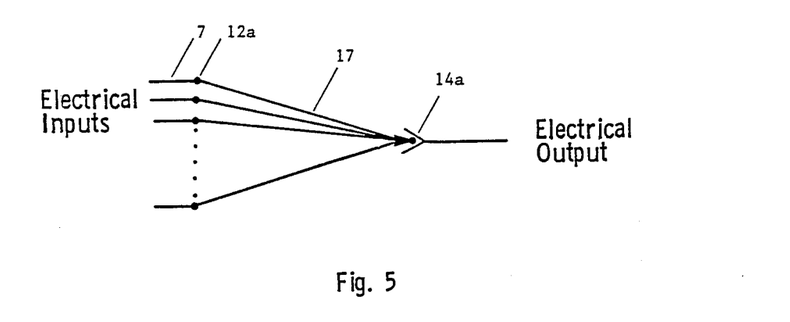
FIG. 5 depicts a hybrid optical electronic technique for implementing the final OR operation in the sequence INVERT-OR-INVERT-OR depicted in FIG. 1.

In the sequence INVERT-OR-INVERT-OR the final OR operation 8 as depicted in FIG. 1 or the parallel OR operations 8a and 8b as depicted in FIG. 4 can be effected by a hybrid optical/electronic approach. This technique is depicted in FIG. 5. Electrical input signals 7 are applied to a series of optical emitters generally indicated by the alphanumeric symbol 12a. The resulting optical output lines with a fan in of q are generally indicated by the numeral 17. These lines coverge to a single detector 14a which then provides the desired electrical output.

Figure 6:
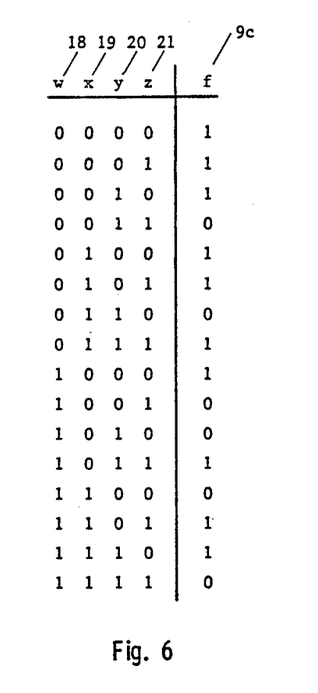
FIG. 6 depicts an arbitrary four-input single-output binary truth table.
Figure 7:
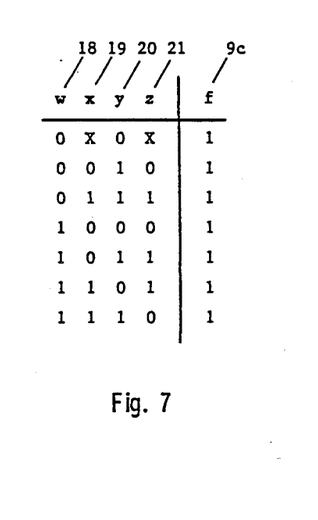
FIG. 7 depicts the reduced binary truth table for the function of FIG. 6.
Figure 8:
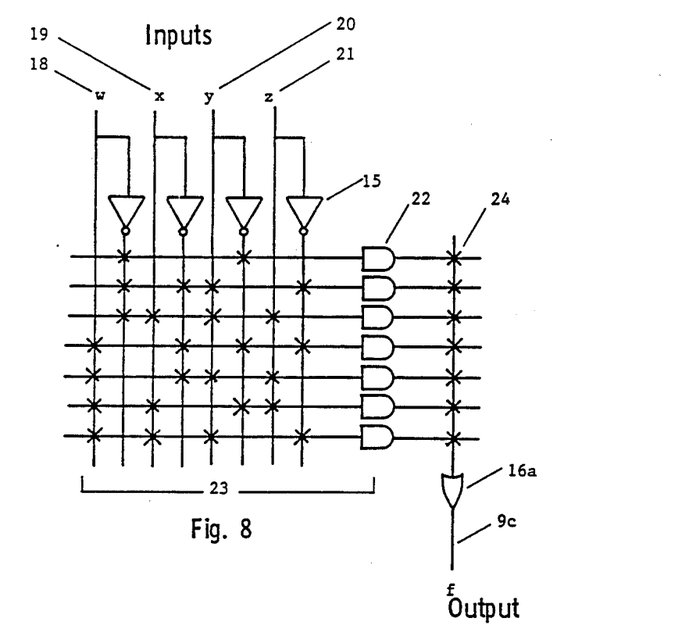
FIG. 8 is a schematic drawing of an AND-OR array with one-bit decoder for effecting the function depicted in FIG. 7.

A specific example of a function to be implemented by the optical INVERT process is provided in FIG. 6. Input variables w, x, y and z respectively indicated by the numerals 18, 19, 20 and 21 are represented in a truth table format that defines a particular output function indicated by the alphanumeric symbol 9c. Using conventional notation, the same truth table with input variables 18, 19, 20, 21 and output function 9c may be represented in reduced form as depicted in FIG. 7. The reduced table depicted in FIG. 7 is readily converted to standard PLA AND-OR logic representation as depicted in FIG. 8. Here input variables 18, 19, 20 and 21 and the INVERT of these signals obtained by use of INVERTERS generally represented by the numeral 15 are either connected or not connected to the inputs of a plurality of multiple-input AND gates that are generally represented by the numeral 22. The presence of a connection is generally represented by "X" such as is shown at the numeral 24. Outputs of the multiple-input AND gates 22 are OR'd together by a multiple-input OR gate 16a to provide the desired output function 9c. The first segment of connections and AND gates is generally referred to as an AND array 23. The schematic illustration of FIG. 8 depicts a system that relies on simple one-bit decoders.

Figure 9:
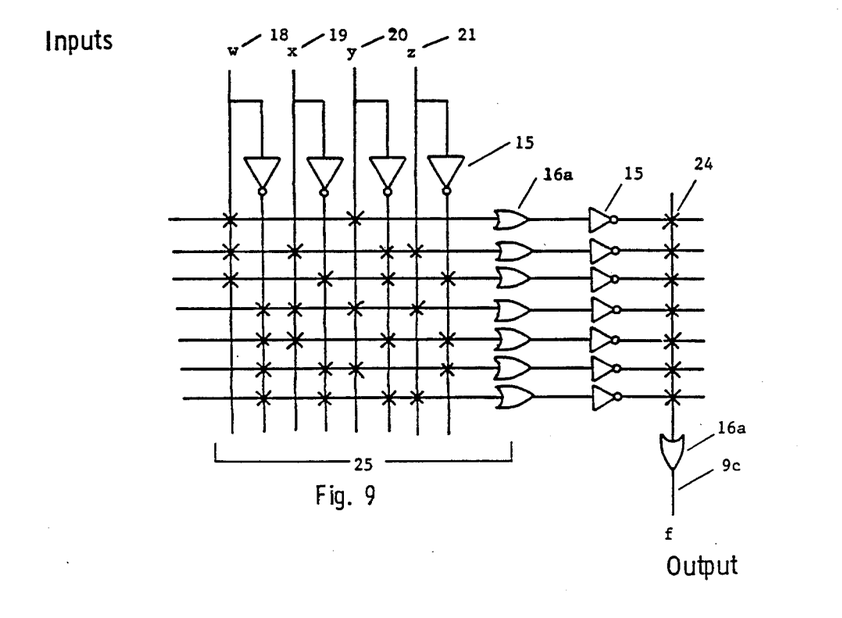
FIG. 9 is an INVERT-OR-INVERT-OR schematic drawing that is functionally equivalent to FIG. 8.

The standard AND-OR representation of FIG. 8 may be depicted equivalently by the INVERT-OR-INVERT-OR representation of FIG. 9. In this case input variables 18, 19, 20 and 21 and the INVERT of these signals obtained by use of INVERTERS 15 are either connected or not connected to the inputs of a plurality of multiple-input OR gates 16a that are generally represented by the numeral 16a. The output from each multiple-input OR gate 16a is INVERTED 15 and the resulting signals are OR'd together by a multiple-input OR gate 16a to provide the desired output function 9c. As before, the presence of a connection is generally indicated by "X" such as is shown at the numeral 24. The first segment of connections and AND gates is generally referred to as an OR array 25. The equivalent system to FIG. 8 depicted in FIG. 9 again relies on simple one-bit decoders.

The principles put forth in this invention rely on a hybrid optical/electronic logic array that implements the sequence INVERT-OR-INVERT-OR. For the hybrid system, the correct mapping procedure requires that a representation of the form presented in FIG. 9 be employed as opposed to the standard form presented in FIG. 8. In referring to FIG. 9, the OR array 25 requires eight inputs and seven multiple-input OR gates 16a. In terms of the basic crossbar architecture described in FIG. 2, this is equivalent to stating that the fan-out factor, q, is equal to seven and the fan-in factor, m, is equal to eight. In addition, eight optical emitters are required, but only four of these are switched on at any given time. The system requires seven detectors. In pratical situations that are governed by cost/performance factors, it is often desirable to vary the hardware requirements in terms of detectors, emitters, peak switching power, fan-in, or fan-out. For the hybrid optical/electronic PLA discussed in this invention, the simple one-bit decoder approach of FIG. 9 is not necessarily the most efficient way to implement the desired output function 9c. Several other possible approaches that also employ the INVERT-OR-INVERT-OR principle must therefore also be considered.

Figure 10:
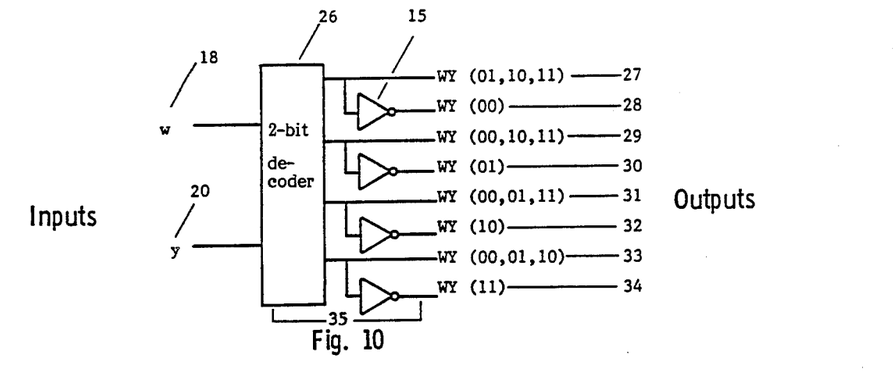
FIG. 10 depicts a particular set of two-bit decoder output literals associated with the binary inputs w and y as defined in FIG. 6.
Figure 11:
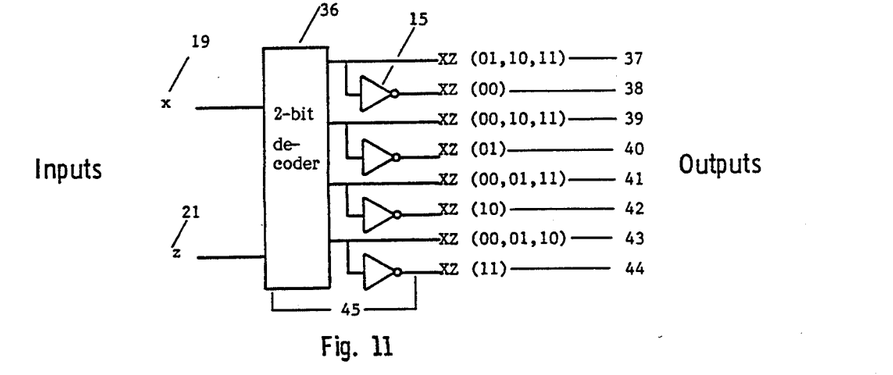
FIG. 11 depicts the output literals of a particular two-bit decoder with the binary inputs x and z as defined in FIG. 6.

Rather than rely on simple one-bit decoders, FIG. 10 depicts a more sophisticated two-bit decoder 26 that generates the output literals 27, 28, 29, 30, 31, 32, 33, 34. This particular two to four decoder 26 takes the input variables 18 and 20 and basically forms a multilevel combinational circuit 35 that generates the desired outputs 27, 28, 29, 30, 31, 32, 33, 34. A second two-bit decoder 36 is depicted in FIG. 11 that takes the input variable 19 and 21 and basically forms another multilevel combinational circuit 45 in order to generate another set of output literals 37, 38, 39, 40, 41, 42, 43, 44. The combination of input variable assignment and choice of proper decoder output function can sometimes result in a considerable decrease in the number of gates or product terms required for AND-OR synthesis as discussed by T. Sasao and H. Terada in a paper entitled "Multiple-Valued Logic and the Design of Programmable Logic Arrays with Decoders," Proceedings of the Ninth International Symposium on Multiple-Valued Logic, pp. 27–37, Library of Congress No. 79CH1408-4C (1979). Similar savings may also be effected in the equivalent hybrid optical/electronic INVERT-OR-INVERT-OR implementation.

Figure 12:
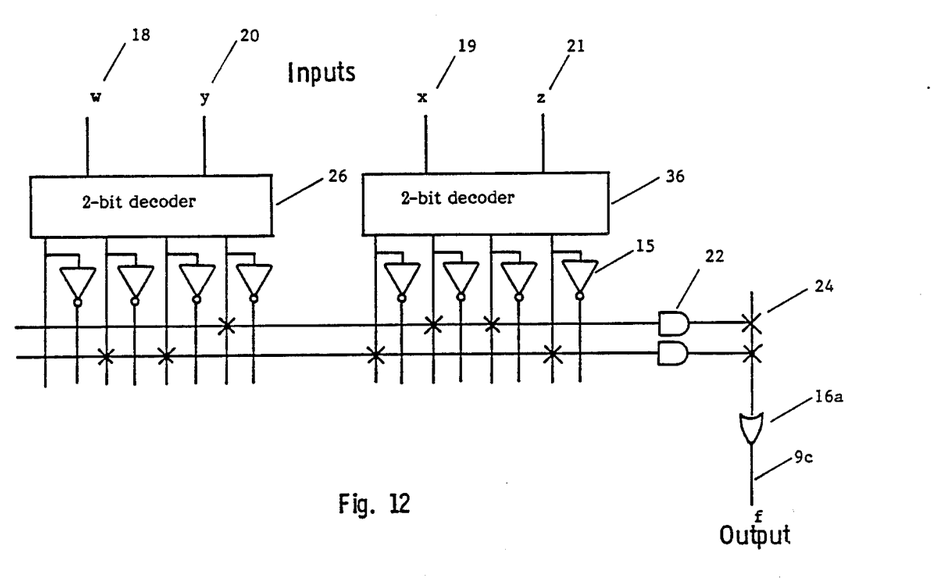
FIG. 12 is a schematic drawing of an AND-OR array with two-bit decoder of the type depicted in FIGS. 10 and 11 for effecting the function depicted in FIG. 7.
Figure 13:
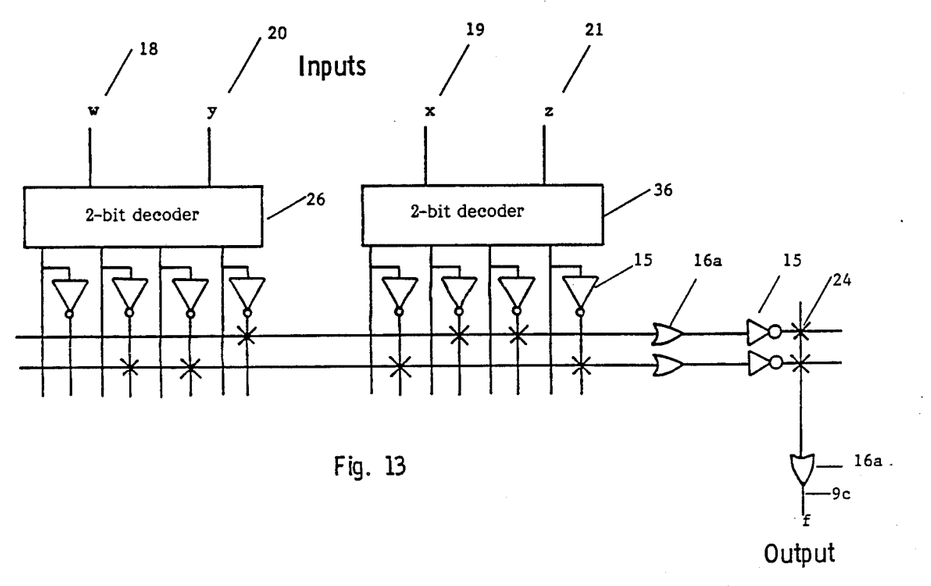
FIG. 13 is an INVERT-OR-INVERT-OR schematic drawing that is functionally equivalent to FIG. 12.

A specific example of how these savings may be effected is presented in FIGS. 12 and 13. Using the two-bit decoders defined in FIGS. 10 and 11, the reduced truth table of FIG. 7 is first converted to standard PLA AND-OR logic representation as depicted in FIG. 12. The figure includes input variables 18, 20, 19, 21, two-bit decoders 26, 36, NOT gates 15, AND gates 22, connections 24, OR gate 16a, and output 9c. In this representation only two AND gates 22 are required. FIG. 13 depicts an equivalent INVERT-OR-INVERT-OR representation that includes input variables 18, 20, 19, 21, two-bit decoders 26, 36, NOT gates 15, OR gates 16a, connections 24, and output 9c. In referring to FIG. 13, the first array of OR gates requires sixteen inputs and two multiple-input OR gates 16a. In terms of the basic crossbar architecture described in FIG. 2, this is equivalent to stating that the fan-out factor, q, is equal to two and the fan-in factor, m, is equal to sixteen. In addition, sixteen optical emitters are required, but only eight of these are switched on at any given time. The system requires two detectors.

Figure 14:
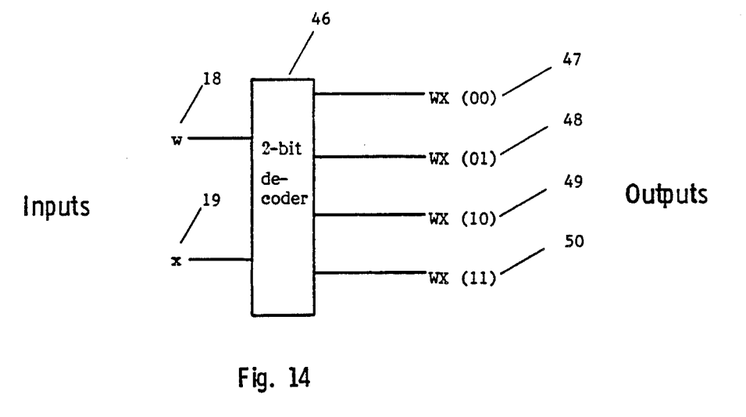
FIG. 14 depicts the output literals of a particular two-bit decoder with the binary inputs w and x as defined in FIG. 6.
Figure 15:
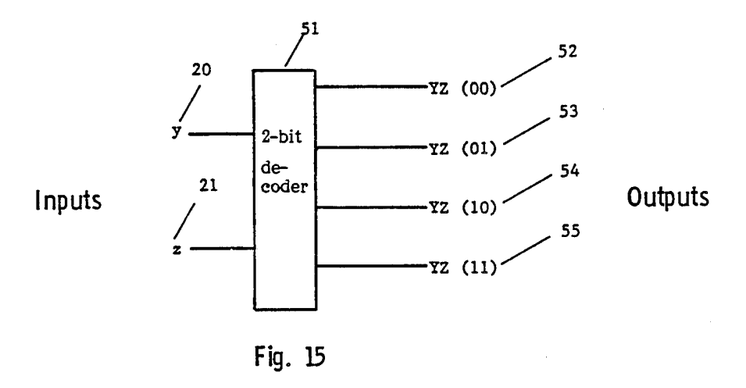
FIG. 15 depicts a particular set of two-bit decoder output literals associated with the binary inputs y and z as defined in FIG. 6.
Figure 16:
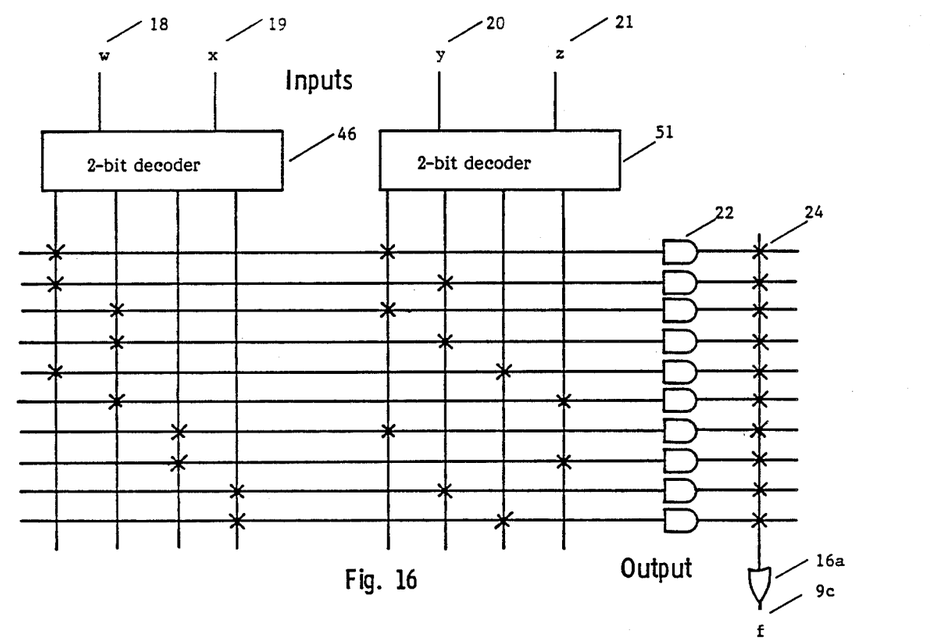
FIG. 16 is a schematic drawing of an AND-OR array with two-bit decoders of the type depicted in FIGS. 14 and 15 for effecting the function depicted in FIG. 7.
Figure 17:
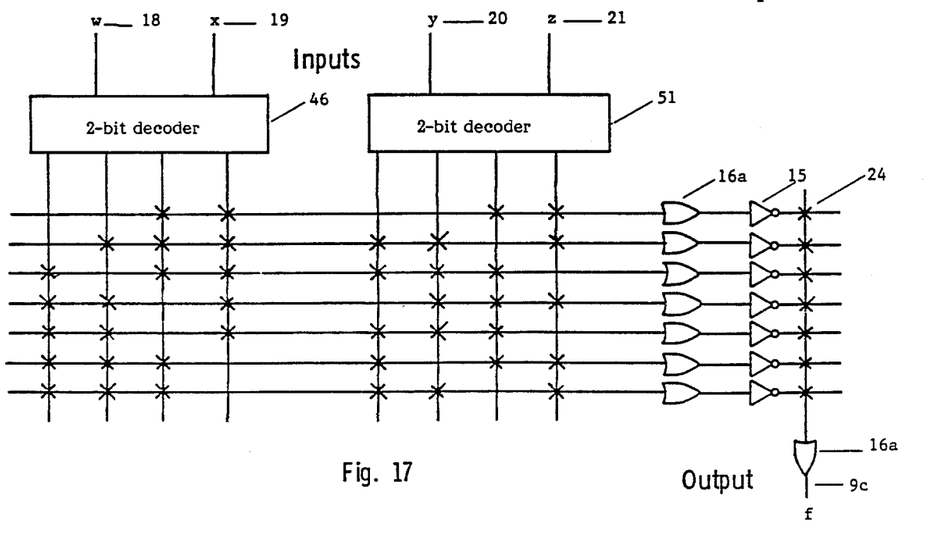
FIG. 17 is an INVERT-OR-INVERT-OR schematic drawing that is functionally equivalent to FIG. 16.

Another possible choice for a two-bit decoder 46 is depicted in FIG. 14. This decoder 46 takes the input variables 18 and 19 and generates the output literals 47, 48, 49, 50. FIG. 15 depicts a second two-bit decoder 51 that takes the input variables 20 and 21 and generates the output literals 52, 53, 54, 55. With this particular choice of decoder a different mix of hardware requirements for the hybrid optical/electronic PLA of this invention may be defined. The procedure is to use the two-bit decoders defined in FIGS. 14 and 15, and convert the reduced truth table of FIG. 7 to standard PLA AND-OR logic representation as depicted in FIG. 16. The figure includes input variables 18, 19, 20, 21, two-bit decoders 46, 51, AND gates 22, connections 24, OR gate 16a, and output 9c. In this representation ten AND gates 22 are required. An equivalent INVERT-OR-INVERT-OR representation is depicted in FIG. 17 that includes input variables 18, 19, 20, 21, two-bit decoders 46, 51, NOT gates 15, OR gates 16a, connections 24, and output 9c. In referring to FIG. 17, the first array of OR gates requires eight inputs and seven multiple-input OR gates 16a. In terms of the basic crossbar architecture described in FIG. 2, this is equivalent to stating that the fan-out factor, q, is equal to seven and the fan-in factor, m, is equal to eight. In addition, eight optical emitters are required, but only two of these are switched on at any given time. The system requires seven detectors.

Figure 18:
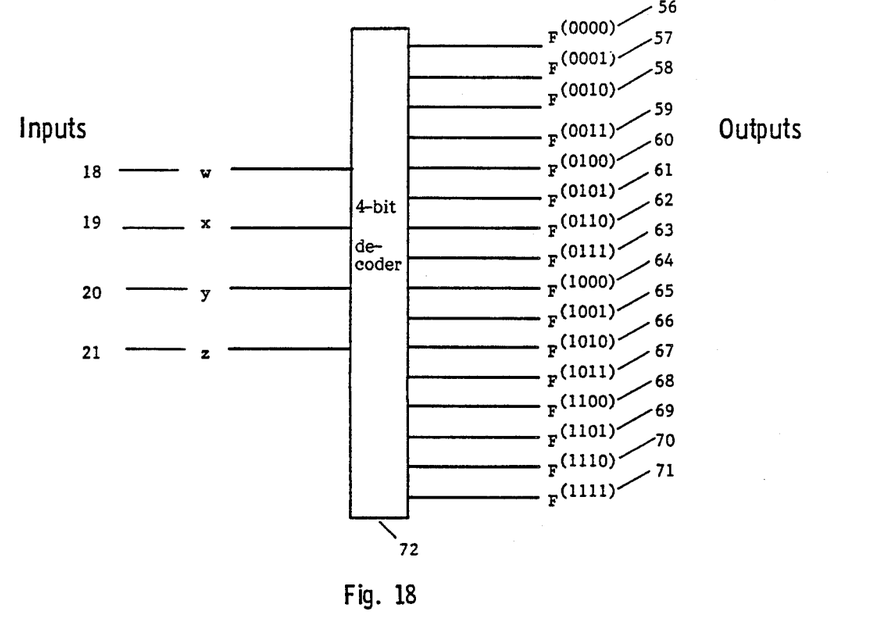
FIG. 18 depicts the output literals of a particular 4:16 decoder with the binary inputs w, x, y, and z as defined in FIG. 6.
Figure 19:
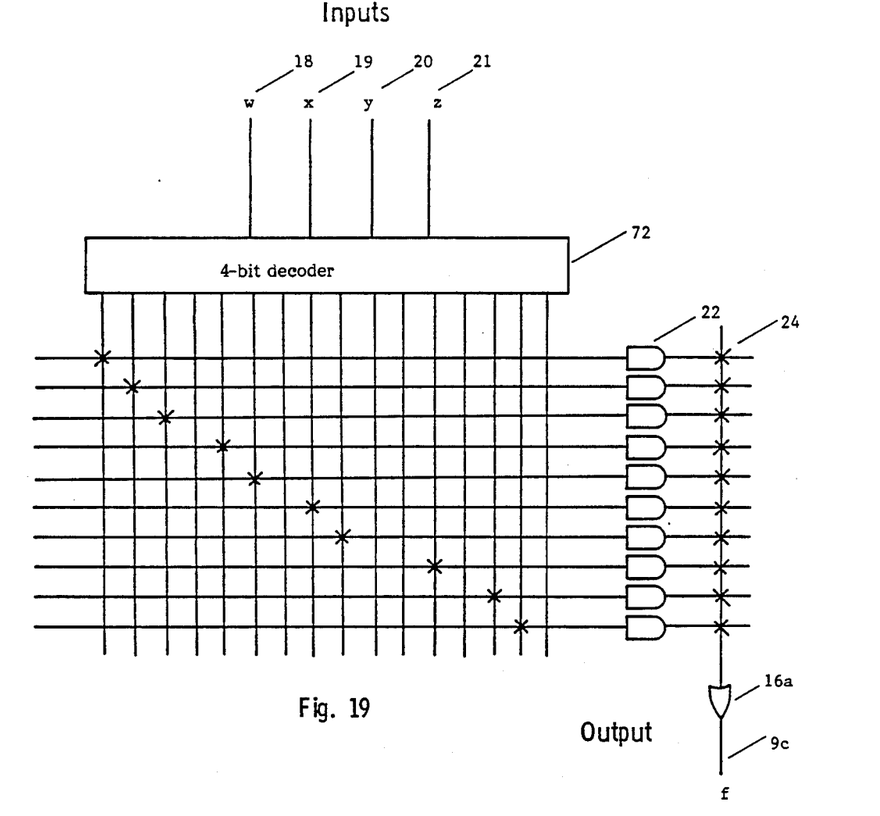
FIG. 19 is a schematic drawing of an AND-OR array with a 4:16 decoder of the type depicted in FIG. 18 for effecting the function depicted in FIG. 7.
Figure 20:
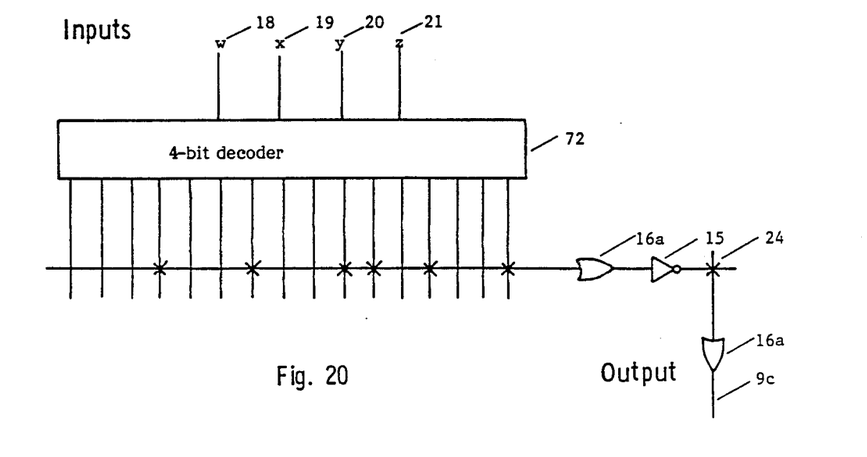
FIG. 20 is an INVERT-OR-INVERT-OR schematic drawing that is functionally equivalent to FIG. 19.

Higher order decoders such as a four to sixteen decoder may result in different hardware requirements for the hybrid optical/electronic PLA described in this invention. One example of a four to sixteen decoder 72 is depicted in FIG. 18. This decoder 72 takes the input variables 18, 19, 20, 21 and generates the output literals 56, 57, 58, 59, 60, 61, 62, 63, 64, 65, 66, 67, 68, 69, 70, 71. With this particular choice of decoder yet another mix of hardware requirements for the hybrid optical/electronic PLA of this invention may be defined. The procedure is to use the four-bit decoder 72 defined in FIG. 18 and convert the reduced truth table of FIG. 7 to standard PLA AND-OR logic representation as depicted in FIG. 19. The figure includes input variables 18, 19, 20, 21, four-bit decoder 72, AND gates 22, connections 24, OR gate 16a, and output 9c. In this representation ten AND gates 22 are required. An equivalent INVERT-OR-INVERT-OR representation is depicted in FIG. 20 that includes input variables 18, 19, 20, 21, four-bit decoder 72, NOT gate 15, OR gates 16a, connections 24, and output 9c. In referring to FIG. 20, the first array of OR gates 16a requires sixteen inputs and only a single multiple-input OR gate 16a. In terms of the basic crossbar architecture described in FIG. 2, this is equivalent to stating that the fan-out factor, q, is equal to one and the fan-in factor, m, is equal to sixteen. In addition, sixteen optical emitters are required, but only one of these is switched on at any given time. The system requires only one detector.

Based on the examples thus far presented, it is evident that various selections of decoders may be used advantageously to provide flexibility in the hardware requirements for implementing the hybrid optical/electronic PLA described in this invention.

What is claimed is:

1. A hybrid optical/electronic INVERT-OR-INVERT logic array, comprising:
   decoder means for converting n binary input signals to m optical output signals, where m and n are each positive integers having a value of at least two;
   first means for effecting a fan-out of said m optical output signals;
   first means for effecting an optical INVERT of said m optical output signals, such that separate switching functions are performed on each of said m distinct optical signals;
   first means for effecting a fan-in of said fanned-out optical signals from said first means for effecting an optical INVERT, including means for effecting individual optical OR operations such that $q_1$ output signals result, where $q_1$ is a positive integer of at least one; and
   first means for INVERTING each of said $q_1$ output signals such that $q_1$ inverted signals are produced.

2. A hybrid optical/electronic logic array, as set forth in claim 1, wherein the first means for effecting an optical INVERT includes spatial light modulator means having a plurality of regions individually switchable between an optically transparent state and an optically opaque state for programmably switching the state of at least selected ones of said m distinct optical signals by selectively switching one or more regions between the transparent state and the opaque state.

3. A hybrid optical/electronic logic array, as set forth in claim 1, wherein the first means for effecting an optical INVERT includes individual optical connection paths which each are individually switchable between an optically transmissive state and an optically opaque state.

4. A hybrid optical electronic logic array, as set forth in claim 3, wherein said individually switchable optical connection paths each includes a pixel, each of said pixels being switchable between an optically transmissive state and an optically opaque state.

5. A hybrid optical/electronic logic array, as set forth in claim 1, further comprising:
   means for effecting a single-output multiple-input OR operation on said $q_1$ inverted signals.

6. A hybrid optical/electronic logic array, as set forth in claim 5, wherein said $q_1$ inverted signals are electrical signals.

7. A hybrid optical/electronic logic array, as set forth in claim 1, further comprising:
   second means for effecting a fan-out of said m optical output signals;
   second means for effecting an optical INVERT of said m optical output signals such that separate switching functions are performed on each of said m distinct optical signals;
   second means for effecting a fan-in of said fanned-out optical signals from said second means for effecting an optical INVERT, including means for effecting individual optical OR operations such that $q_2$ output signals result where $q_2$ is a positive integer of at least one; and
   second means for INVERTING each of said $q_2$ output signals such that $q_2$ inverted signals are produced.

8. A hybrid optical/electronic INVERT-OR-INVERT logic array, as set forth in claim 7, further comprising:
   first means for effecting a final single-output multiple-input OR operation on said $q_1$ inverted signals; and
   second means for effecting a final single-output multiple-input OR operation on said $q_2$ inverted signals, whereby two distinct output signals are produced by the array from the n binary input signals.

9. A hybrid optical/electronic logic array, as set forth in claim 1, wherein said decoder means has at least two decoders, each of said decoders having at least one input for each binary input signal and having at least two parallel outputs.

10. A hybrid optical/electronic logic array, as set forth in claim 1, wherein said decoder means has at least one decoder, said decoder having parallel inputs for at least two binary input signals and having at least four parallel outputs.

11. A hybrid optical/electronic logic array, as set forth in claim 1, wherein said decoder means has at least one decoder, said decoder having parallel inputs for at least three binary input signals and having at least eight parallel outputs.

12. A hybrid optical/electronic INVERT-OR-INVERT logic array, comprising:
   means for providing m optical signals, where m is a positive integer having a value of at least two;
   means for effecting a fan-out of said m optical signals;
   means for effecting an optical INVERT of said m optical signals, such that separate switching functions are performed on each of m distinct optical signals;
   means for effecting a fan-in of said fanned-out optical signals from said means for effecting an optical INVERT, including means for effecting individual optical OR operations such that q1 output signals result, where q1 is a positive integer of at least one; and
   means for INVERTING each of said $q_1$ output signals such that $q_1$ inverted signals are produced, said $q_1$ inverted signals being electrical signals.

13. A hybrid optical/electronic INVERT-OR-INVERT logic array, as set forth in claim 12, wherein said means for effecting an optical INVERT includes a spatial light modulator.

* * * * *